United States Patent
Yang et al.

(10) Patent No.: US 8,541,296 B2
(45) Date of Patent: Sep. 24, 2013

(54) METHOD OF MANUFACTURING DUMMY GATES IN GATE LAST PROCESS

(75) Inventors: Tao Yang, Beijing (CN); Chao Zhao, Kessel-lo (BE); Jiang Yan, Newburgh, NY (US); Junfeng Li, Beijing (CN); Yihong Lu, Beijing (CN); Dapeng Chen, Beijing (CN)

(73) Assignee: The Institute Of Microelectronics Chinese Academy of Science, Beijing (CN)

( * ) Notice: Subject to any disclaimer, the term of this patent is extended or adjusted under 35 U.S.C. 154(b) by 0 days.

(21) Appl. No.: 13/510,730

(22) PCT Filed: Nov. 30, 2011

(86) PCT No.: PCT/CN2011/002001
§ 371 (c)(1),
(2), (4) Date: May 18, 2012

(87) PCT Pub. No.: WO2013/029210
PCT Pub. Date: Mar. 7, 2013

(65) Prior Publication Data
US 2013/0059435 A1    Mar. 7, 2013

(30) Foreign Application Priority Data
Sep. 1, 2011    (CN) .......................... 2011 1 0257658

(51) Int. Cl.
*H01L 21/3205*    (2006.01)
(52) U.S. Cl.
USPC ........... 438/589; 438/179; 438/182; 438/194; 438/201; 438/230; 257/E21.409; 257/336; 257/344; 257/408

(58) Field of Classification Search
USPC ........................................ 438/589
See application file for complete search history.

(56) References Cited

U.S. PATENT DOCUMENTS

| | | | | | |
|---|---|---|---|---|---|
| 4,026,733 | A | * | 5/1977 | Owen et al. ................... | 438/301 |
| 4,074,300 | A | * | 2/1978 | Sakai et al. ................... | 257/387 |
| 4,198,250 | A | * | 4/1980 | Jecmen ........................ | 438/301 |
| 4,319,395 | A | * | 3/1982 | Lund et al. ................... | 438/232 |
| 4,330,931 | A | * | 5/1982 | Liu .............................. | 438/301 |
| 4,379,005 | A | * | 4/1983 | Hovel et al. .................. | 438/571 |
| 4,558,338 | A | * | 12/1985 | Sakata .......................... | 257/387 |
| 4,696,877 | A | * | 9/1987 | Matsui et al. ................. | 430/5 |
| 5,115,290 | A | * | 5/1992 | Murakami et al. ........... | 257/388 |
| 5,462,884 | A | * | 10/1995 | Taniguchi .................... | 438/286 |

(Continued)

FOREIGN PATENT DOCUMENTS
JP    2-188923 A    7/1990

*Primary Examiner* — N Drew Richards
*Assistant Examiner* — Ankush Singal

(57) ABSTRACT

The present invention provides a method of manufacturing a dummy gate in a gate last process, which comprises the steps of forming a dummy gate material layer and a hard mask material layer sequentially on a substrate; etching the hard mask material layer to form a top-wide-bottom-narrow hard mask pattern; dry etching the dummy gate material layer using the hard mask pattern as a mask to form a top-wide-bottom-narrow dummy gate. According to the dummy gate manufacturing method of the present invention, instead of vertical dummy gates used conventionally, top-wide-bottom-narrow trapezoidal dummy gates are formed, and after removing the dummy gates, trapezoidal trenches can be formed. It facilitates the subsequent filling of the high-k or metal gate material and enlarges the window for the filling process; as a result, the device reliability will be improved.

9 Claims, 3 Drawing Sheets

(56) References Cited

U.S. PATENT DOCUMENTS

| | | | | |
|---|---|---|---|---|
| 5,472,564 A | * | 12/1995 | Nakamura et al. | 216/51 |
| 5,734,185 A | * | 3/1998 | Iguchi et al. | 257/336 |
| 5,834,817 A | * | 11/1998 | Satoh et al. | 257/387 |
| 6,013,570 A | * | 1/2000 | Yu et al. | 438/595 |
| 6,060,375 A | * | 5/2000 | Owyang et al. | 438/585 |
| 6,169,009 B1 | * | 1/2001 | Ju et al. | 438/396 |
| 6,191,044 B1 | * | 2/2001 | Yu et al. | 438/713 |
| 6,197,645 B1 | * | 3/2001 | Michael et al. | 438/300 |
| 6,225,150 B1 | * | 5/2001 | Lee et al. | 438/153 |
| 6,284,613 B1 | * | 9/2001 | Subrahmanyam et al. | 438/307 |
| 6,385,018 B1 | * | 5/2002 | Mukoyama | 360/324.12 |
| 6,433,371 B1 | * | 8/2002 | Scholer et al. | 257/288 |
| 6,433,871 B1 | * | 8/2002 | Lensing et al. | 356/450 |
| 6,475,841 B1 | * | 11/2002 | Taylor et al. | 438/197 |
| 6,524,916 B1 | * | 2/2003 | Scholer et al. | 438/270 |
| 7,101,807 B2 | * | 9/2006 | Ishikawa | 438/740 |
| 7,109,128 B2 | * | 9/2006 | Sugiyama et al. | 438/745 |
| 7,208,361 B2 | * | 4/2007 | Shah et al. | 438/199 |
| 7,393,782 B2 | * | 7/2008 | Brintzinger et al. | 438/677 |
| 7,632,670 B2 | * | 12/2009 | Offenhausser et al. | 435/287.1 |
| 7,718,479 B2 | | 5/2010 | Kavalieros et al. | |
| 7,939,895 B2 | * | 5/2011 | Fukasaku | 257/369 |
| 8,168,372 B2 | * | 5/2012 | Sun | 430/311 |
| 8,304,776 B2 | * | 11/2012 | Nam | 257/59 |
| 8,349,675 B2 | * | 1/2013 | Hong | 438/183 |
| 2002/0096490 A1 | * | 7/2002 | Yu | 216/41 |
| 2002/0140041 A1 | * | 10/2002 | Endoh | 257/400 |
| 2003/0211684 A1 | * | 11/2003 | Guo | 438/230 |
| 2003/0227055 A1 | * | 12/2003 | Bae et al. | 257/346 |
| 2003/0235943 A1 | * | 12/2003 | Trivedi | 438/197 |
| 2004/0110327 A1 | * | 6/2004 | Ishikawa | 438/151 |
| 2004/0253829 A1 | * | 12/2004 | Friis et al. | 438/739 |
| 2005/0142804 A1 | * | 6/2005 | Shin | 438/424 |
| 2007/0049030 A1 | * | 3/2007 | Sandhu et al. | 438/689 |
| 2007/0114609 A1 | * | 5/2007 | Akino et al. | 257/347 |
| 2007/0126067 A1 | * | 6/2007 | Hattendorf et al. | 257/412 |
| 2007/0212889 A1 | * | 9/2007 | Abatchev et al. | 438/717 |
| 2008/0026584 A1 | * | 1/2008 | Kanuri et al. | 438/694 |
| 2010/0167021 A1 | * | 7/2010 | Lee et al. | 428/195.1 |
| 2010/0173498 A1 | * | 7/2010 | Abatchev et al. | 438/704 |
| 2010/0267240 A1 | * | 10/2010 | Sandhu et al. | 438/693 |
| 2012/0034747 A1 | * | 2/2012 | Lin | 438/300 |
| 2012/0037953 A1 | * | 2/2012 | Hayano | 257/133 |

* cited by examiner

METHOD OF MANUFACTURING DUMMY GATES IN GATE LAST PROCESS

CROSS-REFERENCE

This application is a National Stage Application of, and claims priority to, PCT Application No. PCT/CN2011/002001, filed on Nov. 30, 2011, entitled "Method of Manufacturing Dummy Gates in Gate Last Process", which claims priority to Chinese Application No. 201110257658.7, filed on Sep. 1, 2011. Both the PCT application and the Chinese application are incorporated herein by reference in their entireties.

FIELD OF THE INVENTION

The present invention relates to a method of manufacturing a semiconductor device, more particularly to a method of manufacturing a dummy gate in a gate last process.

BACKGROUND OF THE INVENTION

The success of high-k metal-gate (HKMG) in the 45 nm technology node has made it key to the process flow for the sub-30 nm technology node. Intel, who has committed to a metal-gate-last approach, is now the leader in mass production of 45 nm and 32 nm chips. And former IBM alliances such as Sumsung, TSMC and Infineon have recently switched from gate-first to gate-last.

In the gate last technology, after performing high temperature ion implant anneal, polycrystalline silicon dummy gates have to be removed, and then high-k and metal gate materials are filled in, as can be seen from the flow in FIG. 1. A pad layer 2 of silicon oxide and a dummy gate layer 3 of polycrystalline silicon are deposited in silicon substrate 1, as shown in FIG. 1A. Gate stack structures are formed by etching. Silicon nitride is deposited and etched to form sidewall spacers 4. Then an interlayer dielectric layer (ILD) 5 of silicon oxide is deposited and is planarized by Chemical Mechanical Polishing (CMP). The dummy gate layer 3 of polycrystalline silicon is removed by means of wet etching with KOH or TAMH following the CMP, and the pad layer 2 is removed preferably by using HF or buffer oxide etch (BOE), as shown in FIG. 1B. Thus, gate trenches are formed. The gate trenches are filled with a high-k gate insulation layer 6 and a gate material layer 7 sequentially and CMP follows, as shown in FIG. 1C.

With the device size scaling down continuously, especially for technical nodes of less than 45 nm, the gate trenches width smaller than 50 nm after removing polycrystalline silicon dummy gates, a depth smaller than 100 nm, and a aspect ratio usually greater than or equal to 1.5. Such rectangular gate trenches with a large aspect ratio and a small size present great challenges to the subsequent high-k and metal gate material filling process in terms of coverage, density and uniformity.

Therefore, there is an urgent need for a method for filling the gate trenches effectively and uniformly.

SUMMARY OF THE INVENTION

Therefore, the object of the present invention is to provide a method of manufacturing a dummy gate in a gate last process, so that the gate trench can be filled effectively and uniformly after removing the dummy gate.

The present invention provides a method of manufacturing a dummy gate in a gate last process, which comprises the following steps: forming a dummy gate material layer and a hard mask material layer sequentially on a substrate; etching the hard mask material layer to form a top-wide-bottom-narrow hard mask pattern; dry etching the dummy gate material layer using the hard mask to form a top-wide-bottom-narrow dummy gate.

In the present invention, the hard mask material layer comprises a first mask layer and a second mask layer located on the first mask layer.

In the present invention, a hard mask pattern having the same width at the top and bottom is formed first by dry etching, then the first mask layer is wet etched to form the top-wide-bottom-narrow hard mask pattern. In the formed top-wide-bottom-narrow hard mask pattern, the second mask layer has an over-hang portion beyond the first mask layer. Wherein, the width of the over-hang portion and the thickness of the dummy gate material layer are adjusted to control an angle of inclination of the dummy gate.

In the present invention, the top-wide-bottom-narrow hard mask pattern is formed by wet etching the hard mask material layer in a single step, and wet etching solution etches the first mask layer faster than the second mask layer.

In the present invention, the first mask layer and the second mask layer comprise silicon oxide, silicon nitride and/or silicon oxynitride.

In the present invention, etching solution used for the wet etching includes DHF, BOE, hot phosphoric acid or $H_2O_2$.

In the present invention, the dummy gate material layer comprises polycrystalline silicon, amorphous silicon, or microcrystal silicon; the substrate comprises bulk silicon, SOI, monocrystalline germanium, GeOI, SiGe, SiC, InSb, GaAs or GaN.

The present invention also provides a gate last process, which comprises the steps of: forming a top-wide-bottom-narrow dummy gate on a substrate using the method of manufacturing a dummy gate in the gate last process as mentioned above; forming sidewall spacers on both sides of the dummy gate; removing the dummy gate to form a top-wide-bottom-narrow gate trench; and filling the gate trench with a gate insulation layer and a gate material.

In the dummy gate manufacturing method according to the present invention, instead of vertical dummy gates used conventionally, top-wide-bottom-narrow trapezoidal dummy gates are formed, and after removing the dummy gates, trapezoidal trenches can be formed. It facilitates the subsequent filling of the high-k or metal gate material and enlarges the window for the filling process; as a result, the device reliability will be improved.

The described object of the present invention as well as other objects that are not mentioned herein is achieved within the scope of the independent claims of this application. The embodiments of the present invention are defined in the independent claims and the specific features are defined in the dependent claims.

BRIEF DESCRIPTION OF THE DRAWINGS

The technical solution of the present invention will be described in detail below with reference to the drawings, wherein.

DETAILED DESCRIPTION OF THE PREFERRED EMBODIMENTS

The features and technical effects of the technical solution of the present invention will be described in detail below with reference to the drawings and in conjunction with the exemplary embodiments, and a method of manufacturing a dummy gate in a gate last process is disclosed. It shall be noted that like reference signs indicate like structures.

Figure 1A:
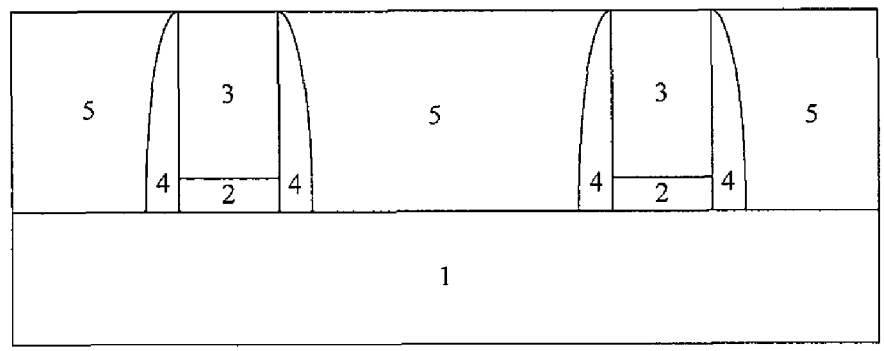
FIG. 1 is a schematic drawing of the gate last process in the prior art.
Figure 1B:
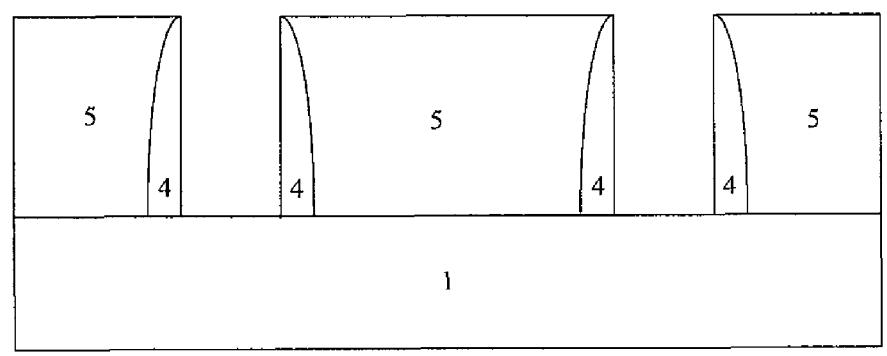
Figure 1C:
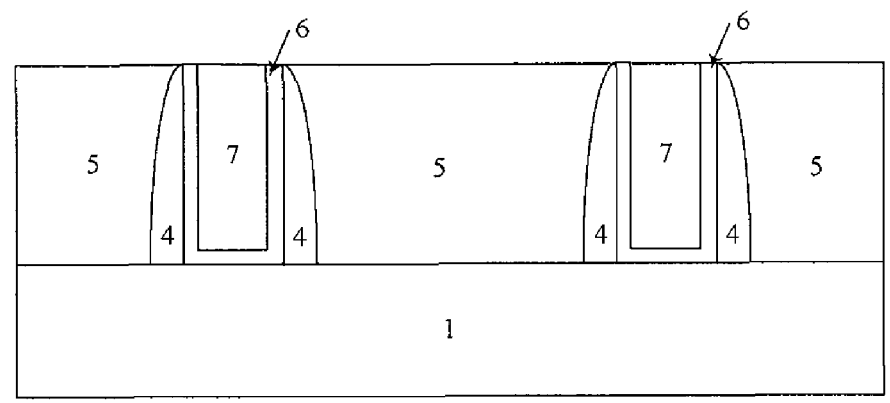
Figure 2:
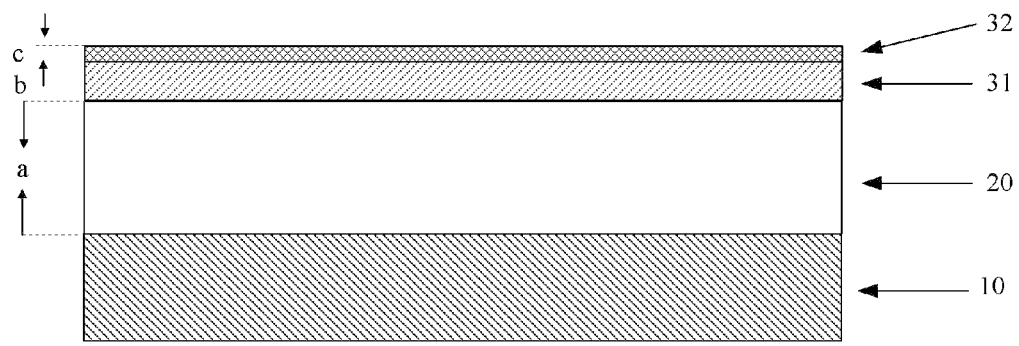
FIGS. 2-7 are sectional views of the respective steps of the method of manufacturing a dummy gate according to the present invention.

First, referring to FIG. 2, a dummy gate material layer 20 and a hard mask material layer 30 comprising a first mask layer 31 and a second mask layer 32 are deposited sequentially on a substrate 10 by, for example, LPCVD and PECVD. According to the electrical properties of the device, the substrate 10 may include, for example, bulk silicon, Silicon-On-Insulator (SOI), monocrystalline germanium, and/or Germanium-On-Insulator (GeOI), or other compound semiconductor materials such as SiGe, SiC, InSb, GaAs and GaN. The dummy gate material layer 20 may comprise materials having different etching selectivity from the materials of the mask layers 31/32, such as polycrystalline silicon, amorphous silicon and/or microcrystal silicon. The first mask layer 31 and the second mask layer 32, which are used as a hard mask layer during etching later, may include silicon oxide, silicon nitride and/or silicon oxynitride. The material of the first mask layer 31 is preferably different from that of the second mask layer 32. For example, silicon oxide 31 may be located below silicon nitride 32, or above silicon nitride 32. Alternatively a three-layered structure may be used. The three layers may have different rates during etching later, especially the bottom layer is etched faster than the middle layer and the middle layer is etched faster than the upper layer. The thickness a of the dummy gate material layer 20 falls into a range of 800~1200 Å, and is preferably 1000 Å, the thickness b of the first mask layer 31 falls into a range of 200-400 Å, and is preferably 300 Å, and the thickness c of the second mask layer 32 falls into a range of 100-200 Å, and is preferably 150 Å. In addition, a silicon oxide pad layer (not shown) may be disposed between the dummy gate material layer 20 and the substrate 10, for protecting the substrate 10 when etching dummy gates.

Figure 3:
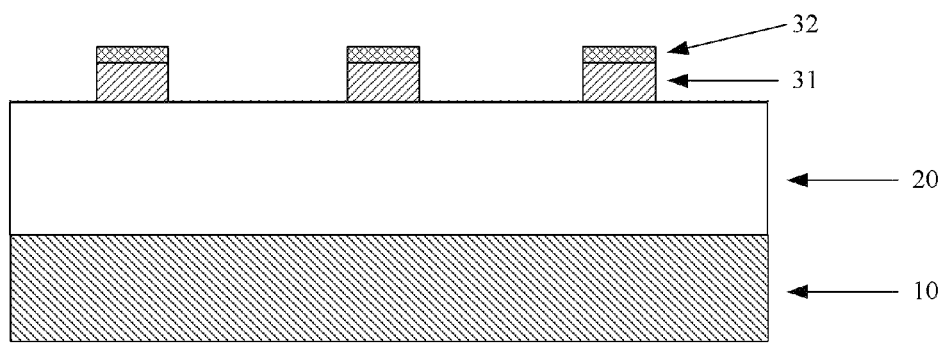

Next, referring to FIG. 3, a hard mask pattern having vertical sidewalls is formed by etching Photo resist (not shown) is coated on the second mask layer 32 and it is exposed and developed to form a photo resist pattern. The second mask layer 32 and the first mask layer 31 are dry etched (such as plasma etching) in turn with the photo resist pattern as a mask, until the dummy gate material layer 20 is exposed. As a result, a hard mask pattern is formed. The hard mask pattern has a line width of, e.g., 200~400 Å, preferably 300 Å. The plasma etching gas may include gas containing halogen, for example, fluoro-gases such as fluorocarbon gas (CxHyFz), $NF_3$, $SF_6$, or other halogen-containing gases such as $Cl_2$, $Br_2$, HBr, HCl, or it may include oxidants such as oxygen, ozone and oxynitride. It shall be noted that the second mask layer 32 at the top is not completely removed during the plasma etching, but remaining a thickness d, which is, for example, greater than or equal to 100 Å. After etching, wet cleaning is performing with de-ionized water and the like or dry cleaning is performing with oxygen, fluorinated gas and the like to completely remove the resultant of etching.

Figure 4:
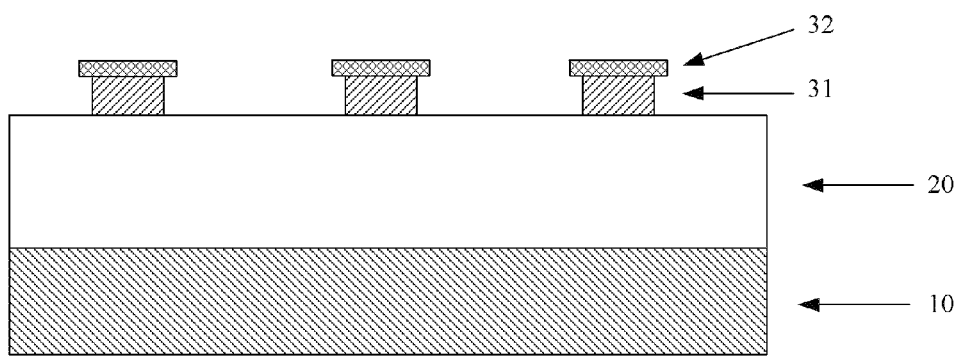

Then, referring to FIG. 4, selective etching is performed so that the hard mask pattern become top-wide-bottom-narrow. Etching solution is selected according to the materials of the first and second mask layers to perform selective wet etching on the first mask layer, thus a top-wide-bottom-narrow hard mask pattern is formed. If the first mask layer 31 is silicon oxide, an HF-based chemical solution, such as diluted hydrofluoric acid (DHF, e.g. HF:$H_2O$=1:100) or buffer oxide etch (BOE, mixture of $NH_4F$ and HF, with a ratio there between being, for example, 2:1 to 4:1), is used, and etching temperature is, for example, 25° C. Since DHF etches the dummy gate material layer 20 of silicon-based material and the second mask layer 32 of silicon nitride more slowly than it etches the first mask layer 31 of silicon oxide, the lines (strips) of the first mask layer 31 will retract laterally, forming a top-wide-bottom-narrow structure similar to a screw cap or a T shape as shown in FIG. 4. If the first mask layer 31 is silicon nitride, hot phosphoric acid that does not react with the second mask layer 32 of silicon oxide may be used to etch the first mask layer 31 laterally, so that the structure as shown in FIG. 4 is formed. The line width of the second mask layer 32 in FIG. 4 still maintains close to or equal to the same in the hard mask pattern in FIG. 3, for example, 200-400 Å, and preferably 300 Å. But the line width of the first mask layer 31 is smaller than that of the second mask layer 32, for example retracting laterally by 70 Å and with only 160 Å left. In other words, the second mask layer 32 has over-hang portions of 70 Å at both sides thereof from the first mask layer 31.

Although FIGS. 3 and 4 show the two mask layers are etched in two steps to form a top-wide-bottom-narrow hard mask pattern, other methods may also be used to form the hard mask pattern. For instance, with respect to the hard mask layers 31/32 of the same material, anisotropic (either dry or wet) etching is performed first to form a pattern with vertical sidewalls and a high aspect ratio. Then isotropic wet etching is performed. Since the pattern has a high aspect ratio, a notable lateral etching will occur. As a result, a top-wide-bottom-narrow pattern is formed. But the verticality of the pattern is not as good as that shown in FIGS. 3-5. With respect to a two-layered structure of different materials (e.g. silicon oxynitride and silicon oxide, wherein a one-step etching may be performed using a mixture of HF and $H_2O_2$), wet etching is performed on the structure shown in FIG. 2 to form the structure shown in FIG. 4 in one step. Wherein, the mixture ratio and temperature of the etching solution are controlled, so that the rate for etching the first mask layer 31 is greater than the rate for etching the second mask layer 32. The resulted hard mask pattern will also be a top-wide-bottom-narrow T shape or screw cap shape. But the obtained hard mask pattern is not as good for etching dummy gates 21 to be described later as that obtained in two steps as shown in FIG. 4, because the amount of lateral etching or the distance of retraction can not be controlled precisely in wet etching But in general, as long as the formed hard mask pattern is wide in top and narrow in bottom, top-wide-bottom-narrow dummy gates can be formed during subsequently etching dummy gates.

Figure 5:
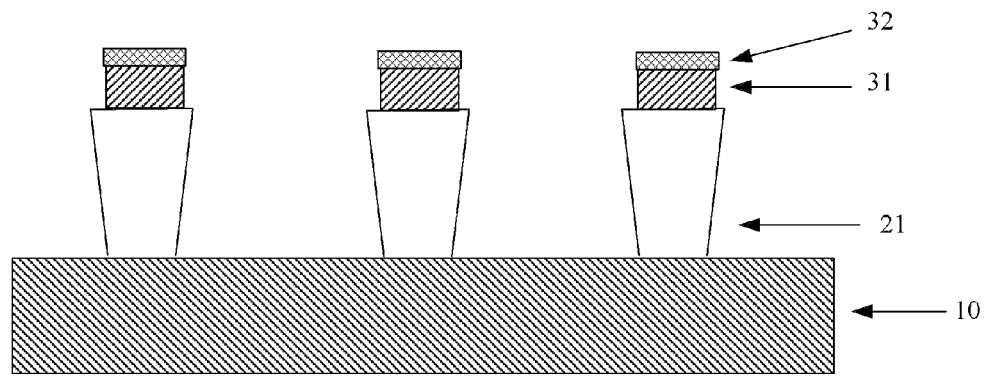

Then, referring to FIG. 5, the dummy gate material layer 20 is dry etched to form top-wide-bottom-narrow dummy gates 21. The same or similar dry etching process used for etching the hard mask pattern, such as plasma etching, is used to etch the dummy gate material layer 20 until the substrate 10 is exposed. During etching, the over-hang portions of the second mask layer 32 will be shortened laterally under the physical strike of the plasma. With the lateral shortening of the second mask layer 32, the etching to the dummy gate material layer 20 will move laterally. Thus after finishing the polycrystalline etching, trapezoidal dummy gates 21 having a certain angle of inclination will be formed, as shown in FIG. 5. Wherein, the line width of the second mask layer 32 is smaller than the same shown in FIG. 4 owing to the strike of the plasma, and is substantially equal to or slightly greater than the line width of the first mask layer 31 shown in FIG. 4. For example, the line width of the first mask layer 31 is 160 Å, and the line width of the second mask layer 32 falls into a range of 160~200 Å. Likewise, with respect to the above-mentioned hard mask patterns of other forms, as long as the top width thereof is greater than the bottom width, the top will gradually retract under the strike of the plasma, and the etching of the dummy gates will move laterally, too.

Figure 6:
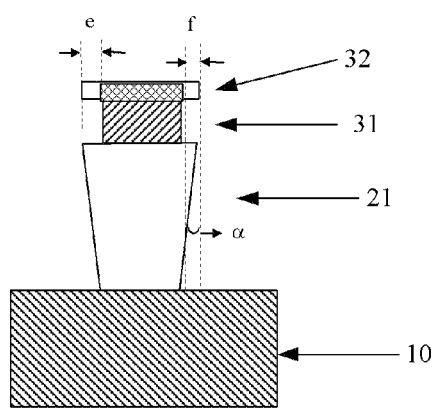

Referring to FIG. 6, which is partial enlargement of FIG. 5. After finishing the wet etching as shown in FIG. 4, the distance between the outer wall of the retracted first mask layer 31 and the outer wall of the second mask layer 32 is e, namely, the width of the over-hang portion; after finishing the dry etching as shown in FIG. 5, the distance is shorten by f. It can be seen that f<=e, wherein f may be adjusted based on e and parameters in the dry etching process, that is, the value of f is decided by the width of the over-hang portion and the dry etching process together. The finally formed angle of inclination $\alpha=\arctan f/a$. In an example, e can be 70 Å, f can be 50 Å, a=1000 Å, the resulted $\alpha$ is 2.86 degree. It can be seen that, the angle of inclination of the finally formed trapezoidal dummy gates 21 can be controlled by controlling the rates of wet lateral etching of the first mask layer 31 and dry etching of the dummy gate material layer 20, i.e. e and f. In the present invention, it is preferably that $\alpha$ is smaller than or equal to 10 degree.

Figure 7:
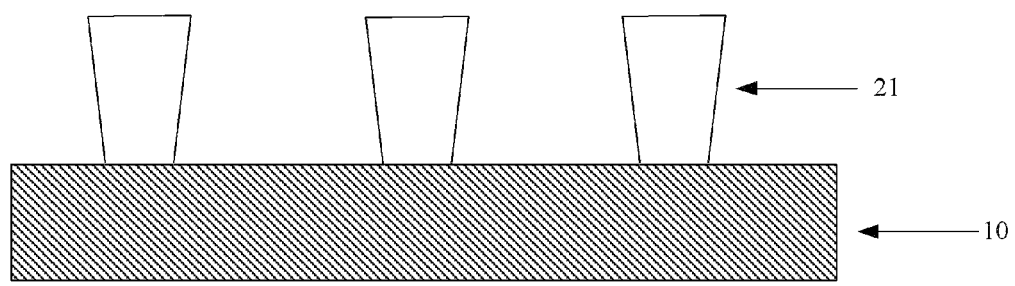

Next, referring to FIG. 7, the hard mask pattern is removed. The hard mask pattern on top of the dummy gate 20 is removed by a wet etching process to obtain trapezoidal dummy gates 21, as shown in FIG. 7. The chemical solution used may be HF-based chemical solution, such as DHF or BOE. In an example, the concentration ratio of DHF is HF:H2O=1:100, and process temperature is 25° C. Different wet etching solutions may be used for the second and the first mask layers, which are made of different materials. For example, the second mask layer 32 of silicon nitride is etched with hot phosphoric acid, and the first mask layer 31 of silicon oxide is etched with HF-based chemical solution. After finishing the wet etching process, the wafer is cleaned and dried.

Then, a conventional sidewall spacer growth, sidewall spacer etching and dummy gate removing processes are performed to finally obtain top-wide-bottom-narrow trapezoidal gate trenches, which facilitate to fill high-k and metal gate material in the next step. Wherein, the dummy gate removing process may use dry etching or wet etching or a mixed process of dry etching and wet etching.

In the dummy gate manufacturing method according to the present invention, instead of vertical dummy gates used conventionally, top-wide-bottom-narrow trapezoidal dummy gates are formed, and after removing the dummy gates, trapezoidal trenches can be formed. It facilitates the subsequent filling of the high-k or metal gate material and enlarges the window for the filling process. As a result, the device reliability will be improved.

While the invention has been described in conjunction with one or several exemplary embodiments, those skilled in the art are aware that various appropriate changes and equivalents may be made to the device structures without departing from the scope of the present invention. In addition, many modifications that may be adapted to specific situations or materials can be made from the disclosed teaching without departing from the scope of the present invention. Therefore, the present invention does not aim at defining the specific embodiments that are disclosed as the most preferred embodiments of the present invention, but the disclosed device structures and their manufacturing methods will include all the embodiments that fall within the scope of the present invention.

What is claimed is:

1. A method of manufacturing a dummy gate in a gate last process, which comprises the following steps:
    forming a dummy gate material layer and a hard mask material layer sequentially on a substrate;
    etching the hard mask material layer to form a top-wide-bottom-narrow hard mask pattern; and
    dry etching the dummy gate material layer using the hard mask pattern as a mask to form a top-wide-bottom-narrow dummy gate,
    wherein the hard mask material layer comprises a first mask layer and a second mask layer located on the first mask layer, and
    wherein the top-wide-bottom-narrow hard mask pattern is formed by wet etching the hard mask material layer in a single step with wet etching solution, which etches the first mask layer faster than etches the second mask layer.

2. The method according to claim 1, wherein a hard mask pattern with vertical sidewalls is formed first by dry etching, then the first mask layer is wet etched to form the top-wide-bottom-narrow hard mask pattern.

3. The method according to claim 1, wherein the first mask layer and the second mask layer comprise silicon oxide, silicon nitride and/or silicon oxynitride.

4. The method according to claim 1, wherein the dummy gate material layer comprises polycrystalline silicon, amorphous silicon, or microcrystal silicon, and the substrate comprises bulk silicon, SOI, monocrystalline germanium, GeOI, SiGe, SiC, InSb, GaAs or GaN.

5. A gate last process, which comprises the steps of:
    forming a top-wide-bottom-narrow dummy gate on a substrate using the method of manufacturing a dummy gate in a gate last process as claimed in claim 1;
    forming sidewall spacers on both sides of the dummy gate;
    removing the dummy gate to form a top-wide-bottom-narrow gate trench; and
    filling the gate trench with a gate insulation layer and a gate material.

6. The method according to claim 1, wherein etching solution for the wet etching includes DHF, BOE, hot phosphoric acid or $H_2O_2$.

7. The method according to claim 2, wherein in the formed top-wide-bottom-narrow hard mask pattern, the second mask layer has an over-hang portion beyond the first mask layer.

8. The method according to claim 2, wherein etching solution for the wet etching includes DHF, BOE, hot phosphoric acid or $H_2O_2$.

9. The method according to claim 7, wherein the width of the over-hang portion and the thickness of the dummy gate material layer are adjusted to control an angle of inclination of the dummy gate.

* * * * *